(12) United States Patent
Zheng et al.

(10) Patent No.: US 10,998,307 B1
(45) Date of Patent: May 4, 2021

(54) CMOS ANALOG CIRCUITS HAVING A TRIODE-BASED ACTIVE LOAD

(71) Applicant: Xilinx, Inc., San Jose, CA (US)

(72) Inventors: Kevin Zheng, San Jose, CA (US); Chuen-Huei Chou, San Jose, CA (US); Hsung Jai Im, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 16/889,533

(22) Filed: Jun. 1, 2020

(51) Int. Cl.
*H03M 1/00* (2006.01)
*H01L 27/02* (2006.01)
*H01L 27/092* (2006.01)
*H03M 1/66* (2006.01)
*H03G 3/00* (2006.01)

(52) U.S. Cl.
CPC ...... *H01L 27/0251* (2013.01); *H01L 27/0922* (2013.01); *H03M 1/66* (2013.01); *H03G 3/007* (2013.01)

(58) Field of Classification Search
CPC .. H01L 27/0251; H01L 27/0922; H03M 1/66; H03M 1/12; H03M 1/1245; H03M 1/129; H03M 1/365; H03M 1/0682; H03M 1/0617; H03M 1/08; H03M 1/204; H03M 1/0607; H03M 1/0863; H03M 1/34; H03G 3/007; H03F 2200/451; H03F 3/211; H03F 3/193; H03F 3/45183; H03F 3/245; H03F 1/0205; H03F 3/19; H03F 1/223; H03K 17/223; H03K 3/012; H03K 3/356156; H03K 19/00315; H03K 5/1565; H03K 5/2481; H03K 19/018521
USPC ......................................... 341/134–136, 142
See application file for complete search history.

(56) References Cited

U.S. PATENT DOCUMENTS

| | | | | |
|---|---|---|---|---|
| 4,068,090 A * | 1/1978 | Komatsu | ................. | H03F 3/185 330/277 |
| 9,531,323 B1 * | 12/2016 | Khalili | ................... | H03B 5/364 |
| 10,298,422 B1 * | 5/2019 | Song | ................. | H04L 25/03057 |
| 2009/0189665 A1 * | 7/2009 | Wu | ....................... | H03K 3/3565 327/206 |
| 2009/0315624 A1 * | 12/2009 | Chow | ...................... | H03F 1/34 330/291 |
| 2010/0244907 A1 * | 9/2010 | Gagne | ............ | H03K 19/018521 327/109 |
| 2012/0293353 A1 * | 11/2012 | Okumura | ............ | H03F 3/45475 341/144 |

(Continued)

OTHER PUBLICATIONS

Zheng et al., "A 56 Gb/s 6 mW 300 um2 Inverter-Based CTLE for Short-Reach PAM2 Applications in 16 nm CMOS," IEEE Custom Integrated Circuits Conference, 4-pages, (Year: 2018).

(Continued)

*Primary Examiner* — Linh V Nguyen
(74) *Attorney, Agent, or Firm* — Paradice and Li LLP

(57) ABSTRACT

An analog signal buffer is disclosed. The analog signal buffer may include a transconductance cell and an active load. The active load may load the current from the transconductance cell with a PMOS transistor and an NMOS transistor and provide a feedback resistance. A transimpedance amplifier is disclosed. The transimpedance amplifier may include a first cell configured to receive a first signal and output a second signal and a second cell coupled to the first cell. The second cell may include an active feedback structure configured to couple an output of the second cell to an input of the second cell.

17 Claims, 10 Drawing Sheets

(56) References Cited

U.S. PATENT DOCUMENTS

| | | | | |
|---|---|---|---|---|
| 2016/0028349 | A1* | 1/2016 | Rajavi | H03B 5/06 |
| | | | | 331/116 FE |
| 2016/0065153 | A1* | 3/2016 | Park | H03F 1/223 |
| | | | | 330/293 |
| 2016/0241220 | A1* | 8/2016 | Rajagopal | H03K 3/3565 |
| 2016/0269029 | A1 | 9/2016 | Chou et al. | |
| 2018/0069552 | A1* | 3/2018 | Singh | H03K 3/356104 |
| 2018/0234096 | A1 | 8/2018 | Li et al. | |
| 2019/0044521 | A1 | 2/2019 | Forey et al. | |
| 2020/0014351 | A1* | 1/2020 | Emira | H03F 3/423 |

OTHER PUBLICATIONS

Zheng et al., "An Inverter-Based Analog Front-End for a 56-Gb/s PAM-4 Wireline Transceiver in 16-nm CMOS," IEEE Solid-State Circuits Letters, vol. 1, No. 12, Dec. 2018, pp. 249-252, Published Jan. 23, 2019, (Year: 2019).

Zheng et al., "CMOS Analog Circuits Having a Triode-Based Active Load," U.S. Appl. No. 16/889,573, filed Jun. 1, 2020.

* cited by examiner

CMOS ANALOG CIRCUITS HAVING A TRIODE-BASED ACTIVE LOAD

TECHNICAL FIELD

Aspects of the present disclosure relate generally to CMOS analog circuits, and more specifically to CMOS analog circuits having a triode-based active load.

BACKGROUND

Many modern circuits receive and/or process analog signals for buffering, filtering, amplification and the like. For example, an analog circuit may buffer an analog signal for sampling by an analog-to-digital converter (ADC). In another example, an equalizing circuit may buffer a high-speed analog communication signal to emphasize frequency content which was attenuated in a communication channel to enable data recovery. Analog signals may have varying bandwidths. Therefore, analog buffers and equalizing circuits capable of handling varying bandwidths are very desirable.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter. Moreover, the systems, methods and devices of this disclosure each have several innovative aspects, no single one of which is solely responsible for the desirable attributes disclosed herein.

One innovative aspect of the subject matter described in this disclosure can be used to buffer analog signals. In some implementations, an analog signal buffer may include a transconductance cell configured to receive a voltage and output a current based on the received voltage. The analog signal buffer may also include an active load. The active load may be configured to receive the current from the transconductance cell and extend bandwidth of the analog signal buffer. The active load may include a first PMOS transistor having a source coupled to a supply voltage and a first NMOS transistor having a source coupled to ground, a drain coupled to a drain of the first PMOS transistor and an output of the transconductance cell, and a gate coupled to the gate of the first PMOS transistor. The active load may also include an active feedback structure configured to couple the drains of the first PMOS transistor and the second PMOS transistor to gates of the first PMOS transistor and the first NMOS transistor.

Another innovative aspect of the subject matter described in this disclosure can be implemented as a transimpedance amplifier. In some implementations, the transimpedance amplifier may include a first cell configured to receive a first signal and output a second signal and a second transconductance cell. The second transconductance cell may include a first PMOS transistor having a source coupled to a supply voltage and a first NMOS transistor having a source coupled to ground. The drain of the first PMOS transistor may be coupled to the drain of the first NMOS transistor and configured to output a third signal. A gate of the first NMOS transistor may be coupled to a gate of the first PMOS transistor. The second transconductance cell may further include an active feedback structure configured to couple an output of the second cell to an input of the second cell.

BRIEF DESCRIPTION OF THE DRAWINGS

The example implementations described herein are illustrated by way of example and are not intended to be limited by the figures of the accompanying drawings. Like numbers reference like elements throughout the drawings and specification. Note that the relative dimensions of the following figures may not be drawn to scale.

DETAILED DESCRIPTION

Figure 1A:
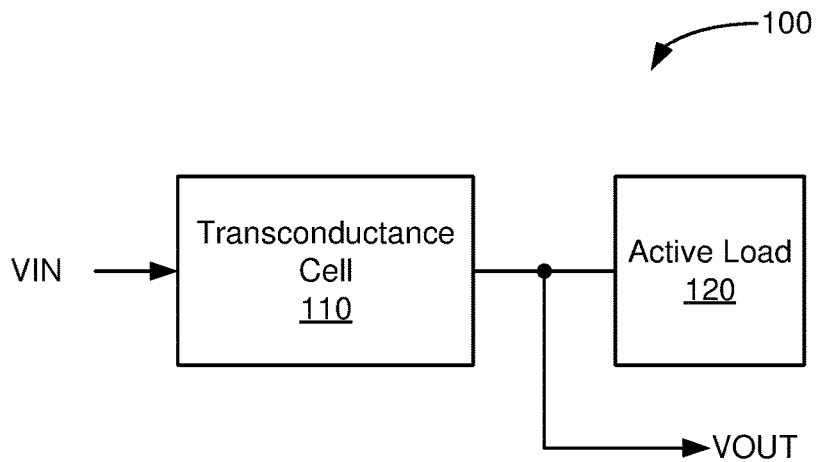
FIG. 1A shows a simplified block diagram of an analog signal buffer.

Implementations of the subject matter described in this disclosure may be used to buffer analog signals. In some implementations, an analog signal buffer may include an active load having at least one PMOS transistor coupled to at least one NMOS transistor, where the transistors are configured to operate in a triode region. The PMOS transistors and the NMOS transistors may provide an effective resistance to load the output of the analog signal buffer.

Implementations of the subject matter described in this disclosure also may be used to equalize analog signals. In some implementations, a continuous time linear equalizer (CTLE) may include a tunable resistor having at least one PMOS transistor coupled to at least one NMOS transistor, where the transistors are configured to operate in the triode region. The PMOS transistors and the NMOS transistors may enable the CTLE to emphasize particular frequencies of the analog signals.

Particular implementations of the subject matter described in this disclosure can be implemented to realize one or more of the following potential advantages. Analog signal buffers using the active load may have a smaller footprint compared to analog signal buffers that use a conventional resistor to load the output of the signal buffer. Some aspects of the present disclosure may track process, voltage, and temperature changes that may affect the analog signal buffer. Still further, a CTLE using one or more tunable resistors may be tuned to operate on different analog signals, thereby reducing the number of CTLEs needed to equalize analog signals of varying bandwidths.

In the following description, numerous specific details are set forth such as examples of specific components, circuits, and processes to provide a thorough understanding of the present disclosure. The term "coupled" as used herein means coupled directly to or coupled through one or more intervening components or circuits. Also, in the following description and for purposes of explanation, specific nomenclature and/or details are set forth to provide a thorough understanding of the example implementations. However, it will be apparent to one skilled in the art that these specific details may not be required to practice the example implementations. In other instances, well-known circuits and devices are shown in block diagram form to avoid obscuring the present disclosure. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. The example implementations are not to be construed as limited to specific examples described herein but rather to include within their scope all implementations defined by the appended claims.

FIG. 1A shows a simplified block diagram of an analog signal buffer 100. The analog signal buffer 100 may include a transconductance cell 110 and an active load 120. The transconductance cell 110 may include a plurality of NMOS and/or PMOS transistors configured to receive an input voltage VIN and to generate an output voltage VOUT. The output of the transconductance cell 110 is coupled to the active load 120. The term "load" may refer to any device or circuit that receives output signals from another device or circuit. The active load 120 may provide a tunable load, with respect to the transconductance cell 110, to extend the functional bandwidth of the analog signal buffer 100. In some implementations, the active load 120 may receive an output current IOUT (not shown for simplicity) and provide the output voltage VOUT. As used herein, the term "cell" may refer to one or more circuits or devices that include at least one connection or port. For example, the transconductance cell 110 may include two ports (VIN and VOUT). Other cells may have one port or three or more ports.

Figure 1B:
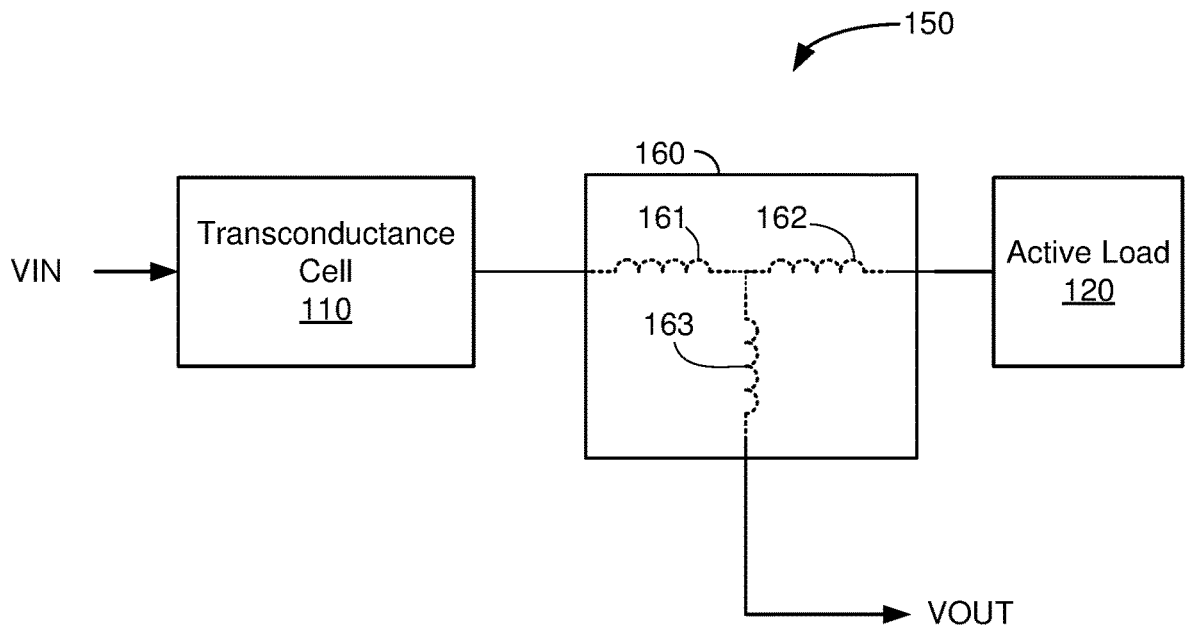
FIG. 1B shows a simplified block diagram of another implementation of an analog signal buffer.

FIG. 1B shows a simplified block diagram of another implementation of an analog signal buffer 150. The analog signal buffer 150 may include the transconductance cell 110 and the active load 120 as described with respect to FIG. 1A. In addition, the analog signal buffer 150 may include a passive peaking block 160.

The passive peaking block 160 may include inductors 161-163. In other implementations, the passive peaking block 160 may include fewer inductors (for example, only one of the inductors 161-163), and/or additional components, such as additional inductors, capacitors and resistors not shown for simplicity. The passive peaking block 160 may perform different types of peaking such as, but not limited to, shunt peaking, series peaking, and t-coil peaking. The peaking provided by the passive peaking block 160 may increase the functional bandwidth of the analog signal buffer 150 beyond the capability of only the active load 120.

Figure 2:
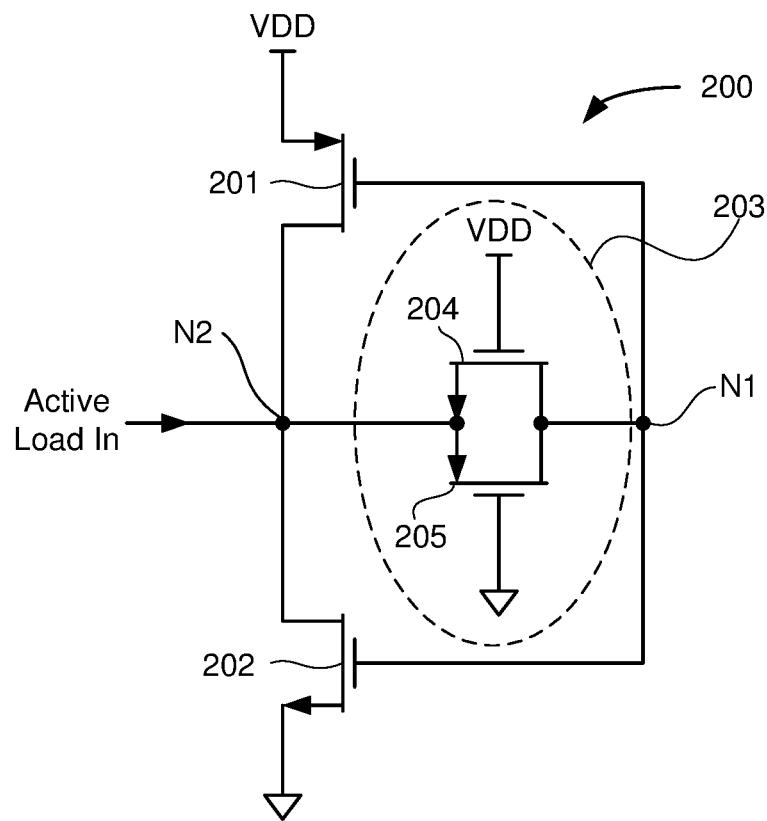
FIG. 2 shows a simplified circuit diagram of an active load.
Figure 2:
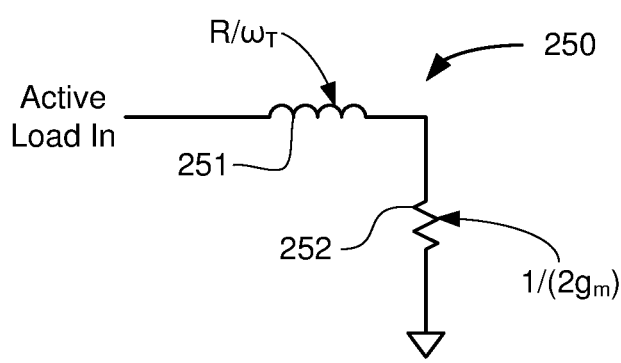

FIG. 2 shows a simplified circuit diagram of an active load 200. The active load 200 may be an implementation of the active load 120 of FIG. 1 and includes a PMOS transistor 201, an NMOS transistor 202, and an active feedback structure 203. In some implementations, the active load 200 may include other components and/or devices not shown for simplicity. For example, biasing devices and circuits for the PMOS transistor 201 and/or the NMOS transistor 202 may be omitted from FIG. 2. In some other implementations, each of the transistors 201 and 202 may be any technically feasible type of transistor including, but not limited to, bipolar transistors, bipolar junction transistors, and the like.

The PMOS transistor 201 and the NMOS transistor 202 may be configured to provide a transconductance gain between nodes N1 and N2. In some implementations, the transconductances of the PMOS transistor 201 and the NMOS transistor 202 may have a common value $g_m$. In some other implementations, the PMOS transistor 201 may have a different transconductance than the NMOS transistor 202. The source of the PMOS transistor 201 may be coupled to a power supply voltage, denoted here as VDD. The drain of the PMOS transistor 201 may be coupled to the drain of the NMOS transistor 202, at node N2. The gate of the PMOS transistor 201 may be coupled to the gate of the NMOS transistor 202, at node N1.

The active feedback structure 203 may include an NMOS transistor 204 and a PMOS transistor 205. In some other implementations, the active feedback structure 203 may include additional components not shown here for simplicity. For example, biasing devices and circuits may be omitted for clarity. The NMOS transistor 204 and the PMOS transistor 205 may each be configured to operate in a triode mode. In some implementations, the gate of the NMOS transistor 204 may be coupled to VDD and the gate of the PMOS transistor 205 may be coupled to ground. In the triode mode, each of the NMOS transistor 204 and the PMOS transistor 205 may be biased by gate voltages to provide a controllable equivalent resistance between node N1 and node N2.

In some implementations, the active load 200 may receive a signal (shown as Active Load In) from a transconductance cell at node N2. The active load 200 may approximate an inductive-resistive load 250. The inductive-resistive load 250 may include an inductor 251 and a resistor 252. The resistor 252 may have a value of $1/(2g_m)$, where $g_m$ is the transconductance associated with each of the PMOS transistor 201 and the NMOS transistor 202. The value of the inductor 251 may be $R/\square_T$ where R is the equivalent resistance and $\square_T$ represents the transit frequency associated with the NMOS transistor 202 and/or the PMOS transistor 201. In some implementations, the transit frequency is based on bias conditions of the NMOS transistor 202 and the PMOS transistor 201.

Figure 3:
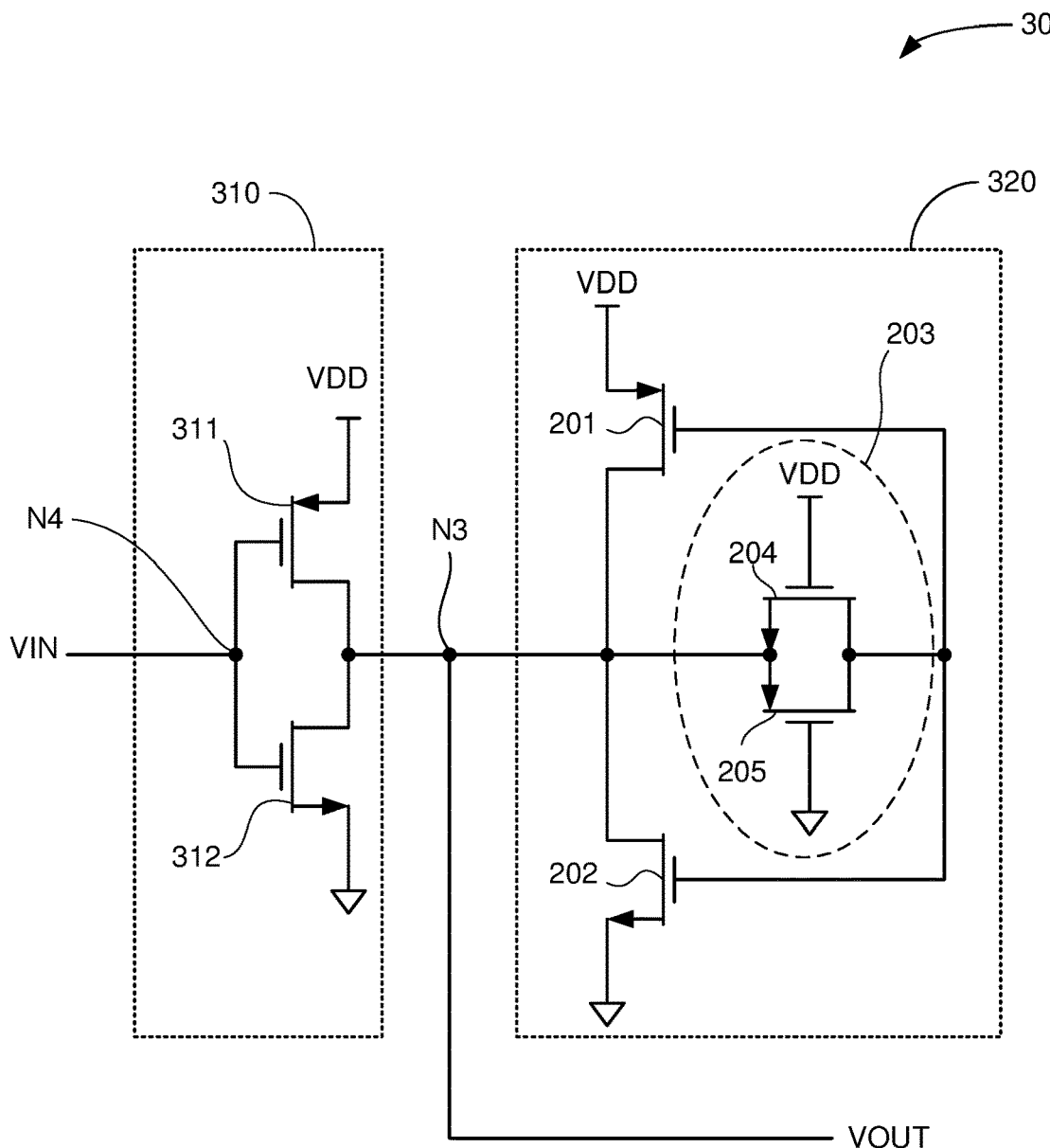
FIG. 3 shows a simplified circuit diagram of an analog signal buffer.
Figure 3:
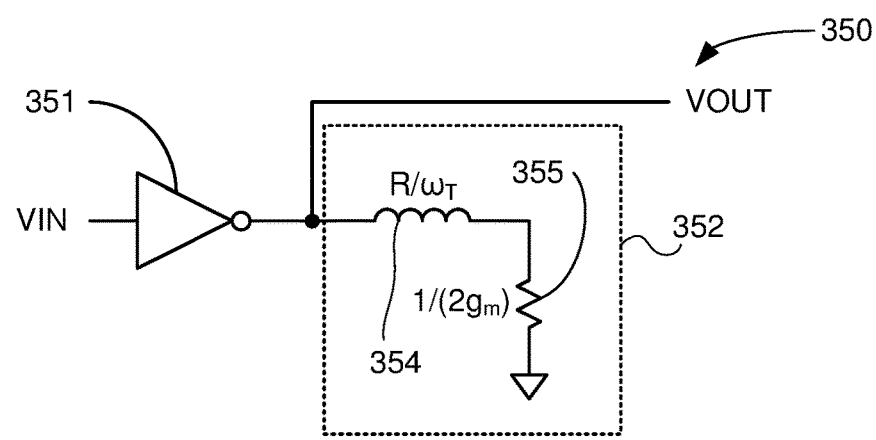

FIG. 3 shows a simplified circuit diagram of an analog signal buffer 300. The analog signal buffer 300 may be an implementation of the analog signal buffer 100 of FIG. 1A or 1B and include a transconductance cell 310 and an active load 320. The transconductance cell 310 may include a PMOS transistor 311 and an NMOS transistor 312. The active load 320 may be similar to the active load 200 and may include the PMOS transistor 201, the NMOS transistor 202, and the active feedback structure 203 of FIG. 2. In some other implementations, each of the PMOS transistors 201, 205, and 311 and each of the NMOS transistors 202, 204, and 312 may be any technically feasible transistor.

The source of the PMOS transistor 311 may be coupled to VDD and the drain of the PMOS transistor 311 may be coupled to the drain of the NMOS transistor 312, at node N3. The source of the NMOS transistor 312 may be coupled to ground. The gates of the PMOS transistor 311 and the NMOS transistor 312 may be coupled together, forming an input port at node N4 to receive the input signal VIN. The transconductance cell 310 may provide an output signal VOUT at an output port, node N3.

The active load 320 may receive the output signal at node N3 and extend an operating bandwidth of the transconductance cell 310 by coupling an equivalent L-R (inductive-resistive load) circuit to the transconductance cell 310 and loading the output signal VOUT. In some implementations, the active load 320 may increase an equivalent impedance as frequency increases. As impedance increases, gain of the transconductance cell 310 may increase and compensate for gain loss at higher frequencies. The active load 320 may occupy less area and user fewer routing resources compared to conventional inductors and resistors. With the reduced area, other elements associated with the active load 320 can be positioned closer to the PMOS transistors 201 and 311 and the NMOS transistors 202 and 312. Further, since the active load 320 may include transistors with characteristics (doping, geometry, and the like) similar to those of the PMOS transistor 311 and the NMOS transistor 312, the effects of process, voltage and temperature (PVT) changes to the active load 320 may track the effects of PVT changes to the PMOS transistor 311 and the NMOS transistor 312. In some implementations, the active load 320 may be tunable, enabling the bandwidth of the analog signal buffer 300 to be extended beyond what would be possible with a fixed active load 320.

The combination of the transconductance cell 310 and the active load 320 may be illustrated with the equivalent circuit 350. The equivalent circuit 350 may include a buffer 351 and an active load 352. The buffer 351 may include the transconductance cell 310 (not shown for simplicity). The active load 352 may include an inductor 354 and a resistor 355. The inductor 354 may have a value of $R/\square_T$. As described with respect to FIG. 2, R is the equivalent resistance provided by the NMOS transistor 204 and the PMOS transistor 205 and $\square_T$ may be associated with the NMOS transistor 202 and the PMOS transistor 201. The resistor 355 may have a value of $1/(2g_m)$, where $g_m$ is the transconductance associated with the PMOS transistor 201 and the NMOS transistor 202.

In some implementations, the analog signal buffer 300 may be used to buffer differential signals. For example, a first analog signal buffer 300 may be used for the first half of a differential signal pair and a second analog signal buffer 300 may be used for the second half of a differential signal pair.

Figure 4:
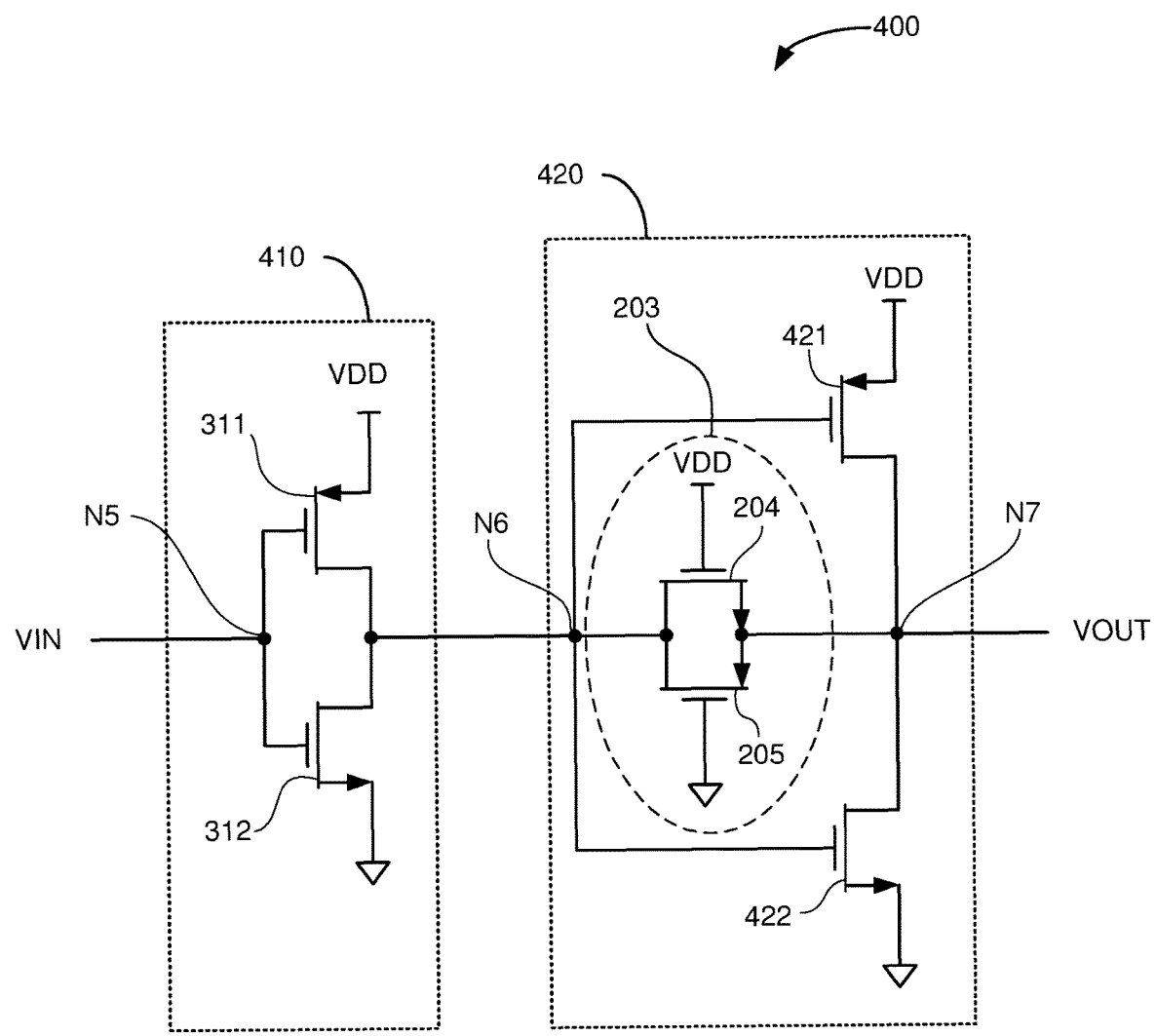
FIG. 4 shows a simplified circuit diagram of a transimpedance amplifier

FIG. 4 shows a simplified circuit diagram of a transimpedance amplifier 400. The transimpedance amplifier 400 may include a transconductance cell 410 and a transimpedance cell 420. The transconductance cell 410 is similar to the transconductance cell 310 and may include the PMOS transistor 311 and the NMOS transistor 312 of FIG. 3. An input signal VIN for the transimpedance amplifier 400 may be received by the transconductance cell 410 at an input port, node N5. An output signal of the transconductance cell 410 is provided to an output port, node N6.

The transimpedance cell 420 may include a PMOS transistor 421, an NMOS transistor 422 and the active feedback structure 203 described with respect to FIG. 2. The source of the PMOS transistor 421 may be coupled to VDD and the drain of the PMOS transistor 421 may be coupled to the drain of the NMOS transistor 422, at node N7. The gate of the PMOS transistor 421 may be coupled to the gate of the NMOS transistor 422, at node N6. The transimpedance cell 420 may receive the output signal from the transconductance cell 410, at node N6.

The active feedback structure 203 may include the NMOS transistor 204 and the PMOS transistor 205 which may be configured to operate in the triode mode. Thus, the active feedback structure 203 may provide an equivalent feedback resistance from node N7 to node N6. The active feedback structure 203 may have a smaller footprint than a conventional resistor. Further, the active feedback structure 203 may track how changes in PVT affect the PMOS transistors 311 and 421 and the NMOS transistors 312 and 422. Moreover, the active feedback structure 203 may be tunable, enable varying amounts of resistance in the feedback path. Example implementations of a tunable active feedback structure 203 are described below with respect to FIGS. 5 and 6.

Figure 5:
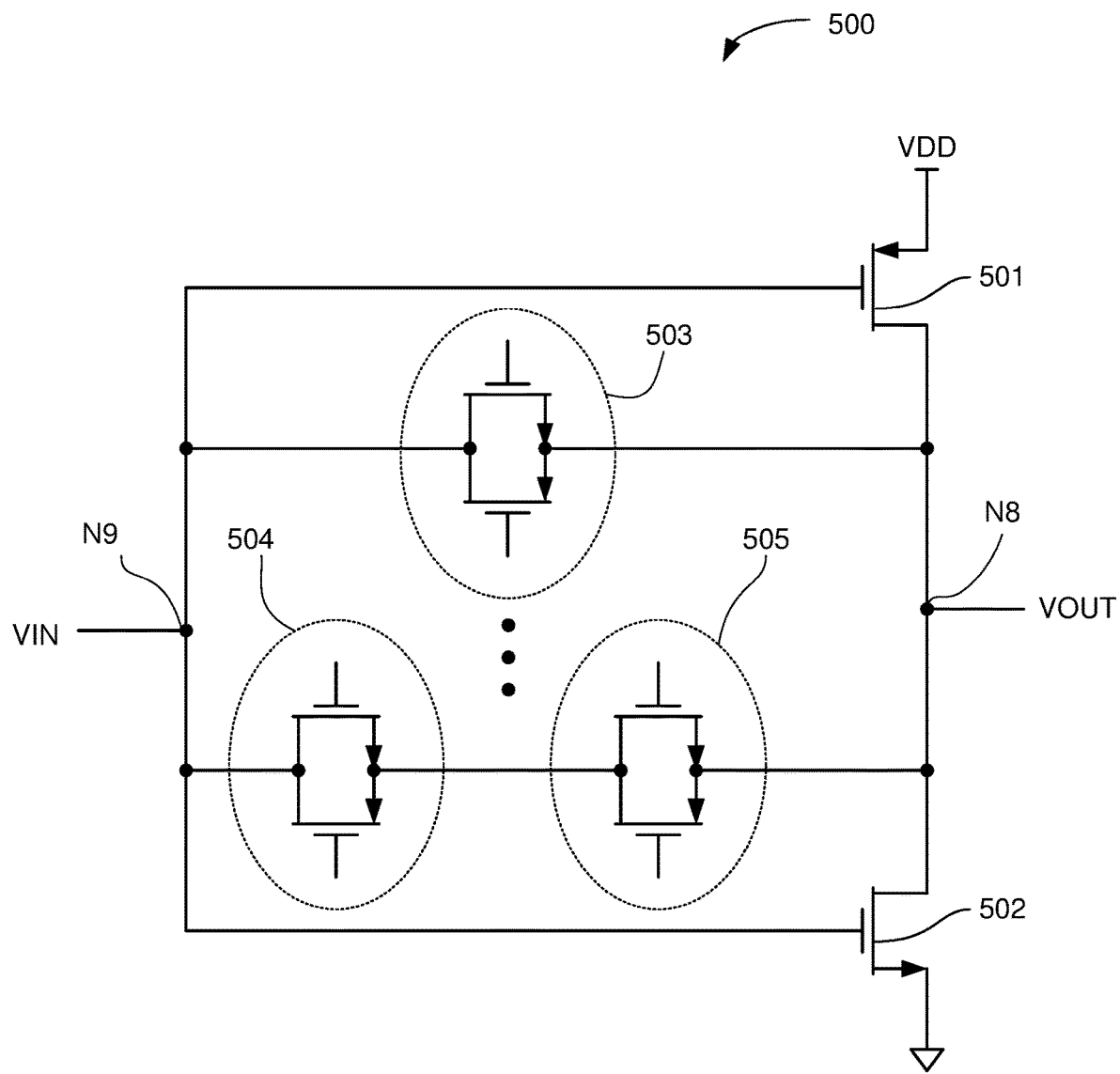
FIG. 5 shows a simplified circuit diagram of another implementation of a transimpedance cell (realized using transconductance cell with active feedback).

FIG. 5 shows a simplified circuit diagram of another implementation of a transimpedance cell 500. The transimpedance cell 500 may be similar to the transimpedance cell 420 of FIG. 4. In some implementations, the transimpedance cell 500 may be used to implement some or all of the active load 320. The transimpedance cell 500 may include a PMOS transistor 501, an NMOS transistor 502, and active feedback structures 503, 504, and 505. The PMOS transistor 501 and the NMOS transistor 502 may be configured to operate as a transconductance buffer. Thus, the source of the PMOS transistor 501 may be coupled to VDD, the drain of the PMOS transistor 501 may be coupled to the drain of the NMOS transistor 502, at node N8, and the source of the NMOS transistor 502 may be coupled to ground. The gate of the PMOS transistor 501 may be coupled to the gate of the NMOS transistor 502, at node N9. In some implementations, the transimpedance cell 500 may receive an input signal VIN at node N9 and provide an output signal VOUT at node N8.

The active feedback structures 503-505 may be similar to the active feedback structure 203 of FIG. 2. Biasing circuits for the active feedback structures 503-505 are omitted for clarity. In one implementation, the active feedback structure 503 may be enabled (e.g., biased to operate) thereby allowing the transimpedance cell 500 to operate similarly to the transimpedance cell 420 of FIG. 4. Thus, the active feedback structure 503 may provide a first equivalent resistance between nodes N8 and N9. In another implementation, the active feedback structures 504 and 505 may be enabled to provide a second effective resistance between nodes N8 and N9. For example, the effective resistance of the active feedback structure 504 may be added to the effective resistance of the active feedback structure 505 to provide a greater effective resistance between the nodes N8 and N9 compared to the active feedback structure 503.

In some other implementations, other combinations of the active feedback structures 503-505 may be used to provide different effective resistances between the nodes N8 and N9. For example, the active feedback structures 503-505 may be enabled simultaneously to provide two parallel resistance paths between the nodes N8 and N9. This parallel resistance may have an equivalent resistance that is less than either the effective resistance of the active feedback structure 503 or the combined effective resistance of the active feedback structures 504 and 505.

In some implementations, each of the active feedback structures 503-505 may include transistors with similar device characteristics including, but not limited to, channel width, channel length, channel area, threshold voltage, bias voltage, or any other feasible device characteristic. In some other implementations, each of the active feedback structures 503-505 may have different device characteristics. Implementations with different device characteristics enable the active feedback structures 503-505 to provide different effective resistances. Although only three active feedback structures 503-505 are described in this example, in some other implementations, the transimpedance cell 500 may include any feasible number of active feedback structures.

When the transimpedance cell 500 is used to implement the active load 320 by coupling N8 (instead of N9) to a transconductance cell output, the effective inductance of the active load cell may be modified by changing the effective resistance between the nodes N8 and N9. As described herein, the effective resistance may be changed by enabling different combinations of the active feedback structures 503-505 and/or using active feedback structures 503-505 with different device characteristics. When the transimpedance cell 500 is used to implement the transimpedance cell 420, the active feedback structures 503-505 provide an effective feedback resistance between the nodes N8 and N9.

Figure 6:
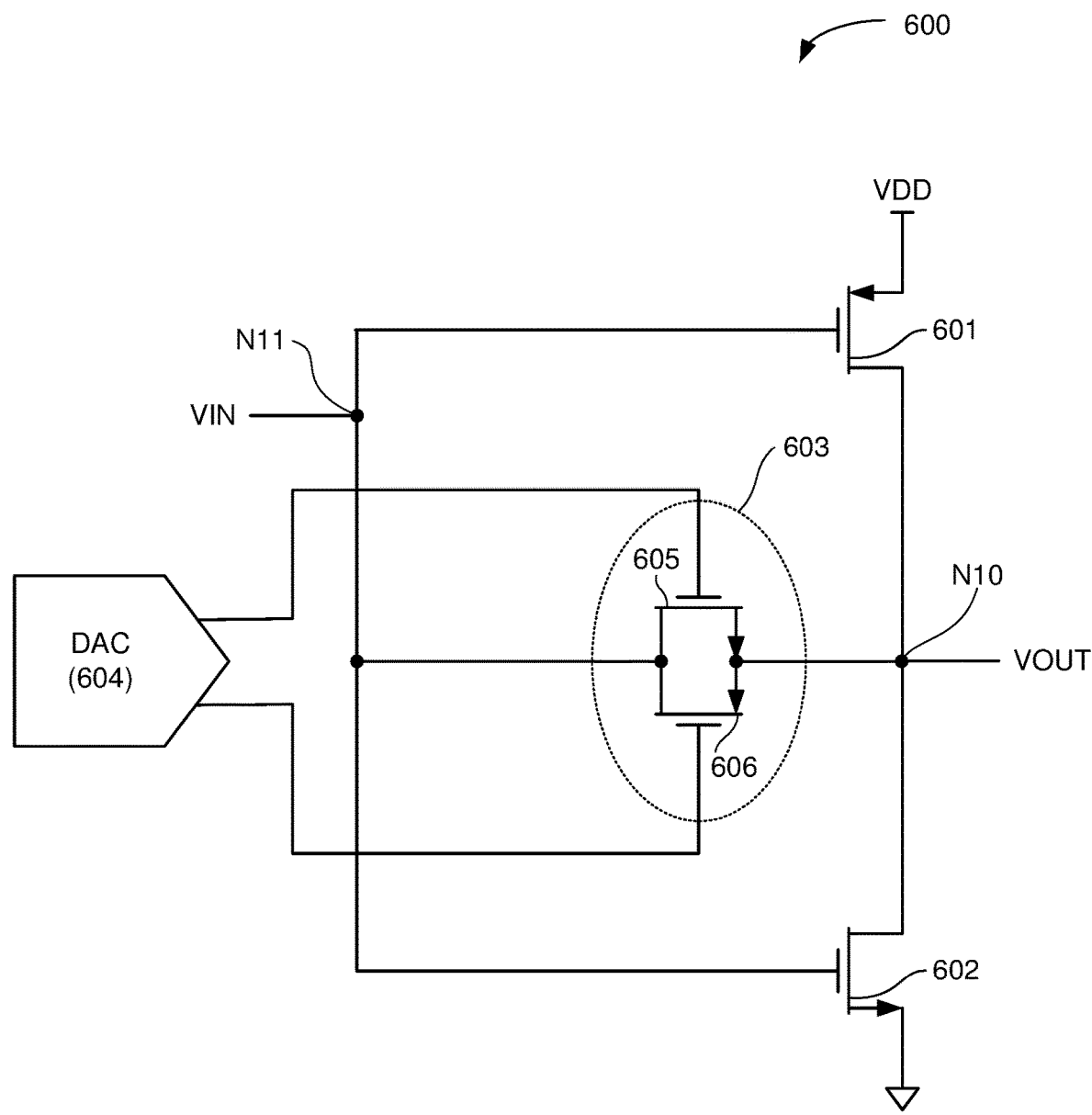
FIG. 6 shows a simplified circuit diagram of another implementation of a transimpedance cell (realized using transconductance cell with active feedback).

FIG. 6 shows a simplified circuit diagram of another implementation of a transimpedance cell 600 The transimpedance cell 600 may include a PMOS transistor 601, an NMOS transistor 602, an active feedback structure 603, and a digital-to-analog converter (DAC) 604. The source of the PMOS transistor 601 may be coupled to VDD, the drain of the PMOS transistor 601 may be coupled to the drain of the NMOS transistor 602, at node N10, and the source of the NMOS transistor 602 may be coupled to ground. The gate of the PMOS transistor 601 may be coupled to the gate of the NMOS transistor 602, at node N11. In some implementations, the transimpedance cell 600 may receive an input signal VIN at node N11 and provide an output signal VOUT at node N10.

The active feedback structure 603 may be similar to the active feedback structure 203 of FIG. 2. Thus, the active feedback structure 603 may include an NMOS transistor 605 and a PMOS transistor 606 configured to operate in the triode mode. The source of the NMOS transistor 605 may be coupled to the source of the PMOS transistor 606, at the node N10. The drain of the NMOS transistor 605 may be coupled to the drain of the PMOS transistor 606, at the node N11.

The gates of the NMOS transistor 605 and the PMOS transistor 606 may be coupled to the DAC 604. In some implementations, the DAC 604 may control and/or vary the equivalent resistance provided by the active feedback structure 603 by varying the voltage supplied to the gates of the NMOS transistor 605 and the PMOS transistor 606. In this manner, the transimpedance cell 600 may share the flexibility of the transimpedance cell 500 with fewer active feedback structures, thereby saving area and power.

Similar to as described with respect to the transimpedance cell 500, the transimpedance cell 600 may be used to implement the active load 320 of FIG. 3. For example, the transimpedance cell 600 may be used to implement the active load 320 by coupling N10 to the output of a preceding transconductance cell.

Figure 7:
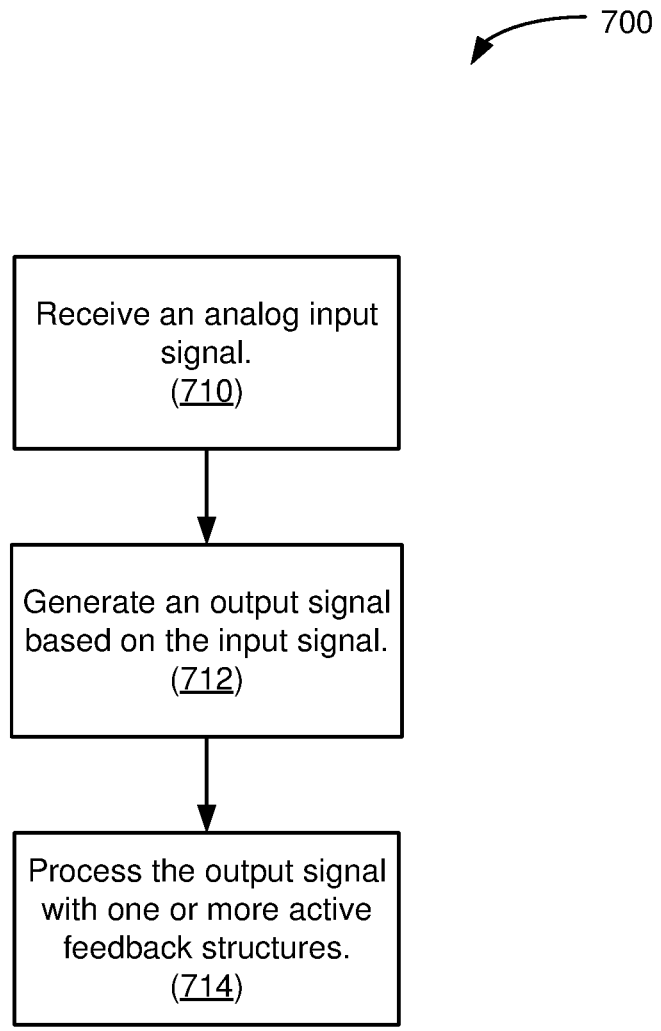
FIG. 7 shows an illustrative flowchart depicting an example operation for operating an analog signal buffer.

FIG. 7 shows an illustrative flowchart depicting an example operation 700 for operating an analog signal buffer. Although described with respect to the analog signal buffer 300 of FIG. 3, the operation 700 may be used to operate the transimpedance amplifier 400 of FIG. 4, or any other feasible analog signal buffer or amplifier. In some implementations, the operation described herein may include additional processes, fewer processes, processes in a different order, processes in parallel, and/or some processes that are different.

The analog signal buffer 300 receives an analog input signal (710). For example, the analog signal buffer may receive an analog input signal VIN from off chip or from adjacent on-chip circuitry. The analog signal buffer 300 may generate an output signal based on the input signal (712). For example, the analog signal buffer 300 may generate an output signal VOUT based on an input signal VIN.

The analog signal buffer 300 processes the output signal with one or more active feedback structures (714). For example, the VOUT signal may be processed by the active load 320 which includes one or more active feedback structures 203. In other implementations, the output signal may be processed by the transimpedance cell 420 which includes one or more active feedback structures 203.

In some implementations, the active feedback structure 203 may also be used to implement a continuous time linear equalizer (CTLE). A CTLE may be used to recover and/or emphasize frequencies in an analog signal, such as a serial communication signal, that may have been lost or attenuated during transmission through a communication channel. The tunable effective resistance of the active feedback structure 203 may enable the CTLE to operate over a wider bandwidth than a CTLE implemented with fixed resistances and/or capacitors.

Figure 8:
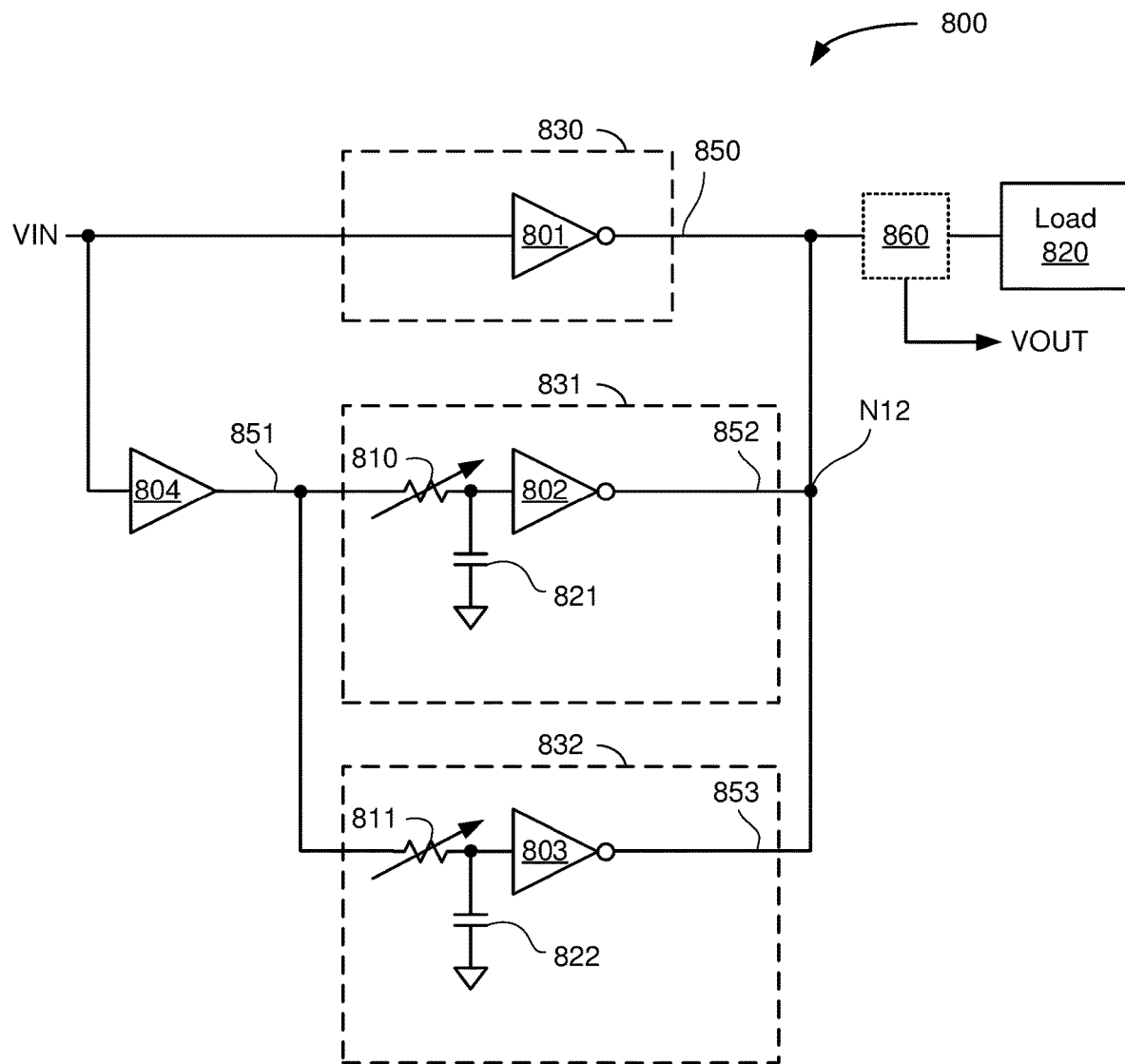
FIG. 8 shows a simplified diagram of a continuous time linear equalizer.

FIG. 8 shows a simplified diagram of a CTLE 800. The CTLE 800 may include transconductance cells 801-803, a negative gain buffer 804, a first variable resistor 810, a second variable resistor 811, a first capacitor 821, a second capacitor 822, a passive peaking block 860, and an active load 820. The CTLE 800 may generate an output signal VOUT based on an input signal VIN. In some implementations, the input signal VIN may be a serial communication signal such as a gigabit signal or a 112G signal. The active load 820 may be an implementation of the active load 200.

In some implementations, the CTLE 800 may include an all-frequency section 830, a mid-frequency section 831, and a high-frequency section 832. The all-frequency section 830 may include the transconductance cell 801, the mid-frequency section 831 may include the first variable resistor 810, the first capacitor 821, and the transconductance cell 802, and the high-frequency section 832 may include the second variable resistor 811, the second capacitor 822, and the transconductance cell 803. In some implementations, the all-frequency section 830, the mid-frequency section 831, and the high-frequency section 832 may include other components or devices not shown here for simplicity.

The transconductance cells 801-803 and the negative gain buffer 804 may buffer and invert electrical signals. For example, the transconductance cell 801 may buffer and invert the input signal VIN and provide a first intermediate signal 850 to node N12, which may function as a summing node. The negative gain buffer 804 may also buffer and invert the input signal VIN and provide a second intermediate signal 851 to the mid-frequency section 831 and the high-frequency section 832.

The CTLE 800 may "equalize" the input signal VIN by selectively emphasizing and/or attenuating certain frequencies of the input signal VIN. The first variable resistor 810, the first capacitor 821, and the transconductance cell 802 may buffer and select mid-frequencies of the input signal VIN providing a third intermediate signal 852 to be subtracted from the first intermediate signal 850 at node N12. In some implementations, the first variable resistor 810 and the first capacitor 821 may select and/or determine a range of frequencies of the input signal VIN (e.g., the mid-frequencies) that are buffered by the transconductance cell 802. The negative gain buffer 804 in combination with the transconductance cell 802 may provide an inverted signal (with respect to an output signal from the transconductance cell 801) to node N12. As a result, by summing the first intermediate signal 850 and the third intermediate signal 852 at node N12, the amplitude of the third intermediate signal 852 is effectively subtracted from the amplitude of the first intermediate signal 850 at node N12.

Similarly, the second variable resistor 811, the second capacitor 822, and the transconductance cell 803 may buffer and select high-frequencies of the input signal VIN providing a fourth intermediate signal 853 to be subtracted from the first intermediate signal 850 at node N12. Thus, the output signal VOUT may be based on the first intermediate signal 850 minus the third intermediate signal 852 and the fourth intermediate signal 853. In this manner, the mid-frequency section 831 and the high-frequency section 832 may determine which frequencies of the input signal VIN are to be attenuated. The frequencies of the input signal VIN that are not attenuated are emphasized.

In some implementations, the resistive value of the second variable resistor 811 may be much smaller than the resistive value of the first variable resistor 810. Such a configuration may provide greater separation between the frequencies selected by the mid-frequency section 831 and the frequencies selected by the high-frequency section 832. For example, the resistive value of the second variable resistor 811 may be orders of magnitude (e.g., ten times) smaller than the resistive value of the first variable resistor 810.

In some implementations, the first capacitor 821 and the second capacitor 822 may be variable capacitors (not shown for simplicity). Changing the resistances of the first variable resistor 810 and the second variable resistor 811 and/or the capacitances of the first capacitor 821 and the second capacitor 822 may cause the mid-frequency section 831 and the high-frequency section 832 to buffer and select different frequencies of the input signal VIN. In this manner, the CTLE 800 may be tuned to equalize different analog signals having different bandwidths. In some implementations, the variable resistors 810 and 811 and first capacitor 821 and second capacitor 822 may allow the CTLE 800 to equalize gigabit signals, 112 G signals, or any other technically feasible signal.

In some implementations, the active load 820 may extend the operating bandwidth of the CTLE 800 by coupling an equivalent L-R circuit to node N12 and loading the signal at node N12 (similar to as described with respect to FIG. 2). In some implementations, the active load 820 also may include active feedback structures as described with respect to FIGS. 5 and 6. The passive peaking block 860 may include inductors, capacitors, resistors and the like to emphasize or "peak" one or more frequencies similar to as discussed with respect to the passive peaking block 160 of FIG. 1B. Thus, as described in FIG. 1B, VOUT of the CTLE 800 may be provided by the passive peaking block 860. The passive peaking block 860 may be optional as denoted with dotted lines in FIG. 8. If the passive peaking block 860 is omitted, then VOUT may be provided at node N12.

Figure 9:
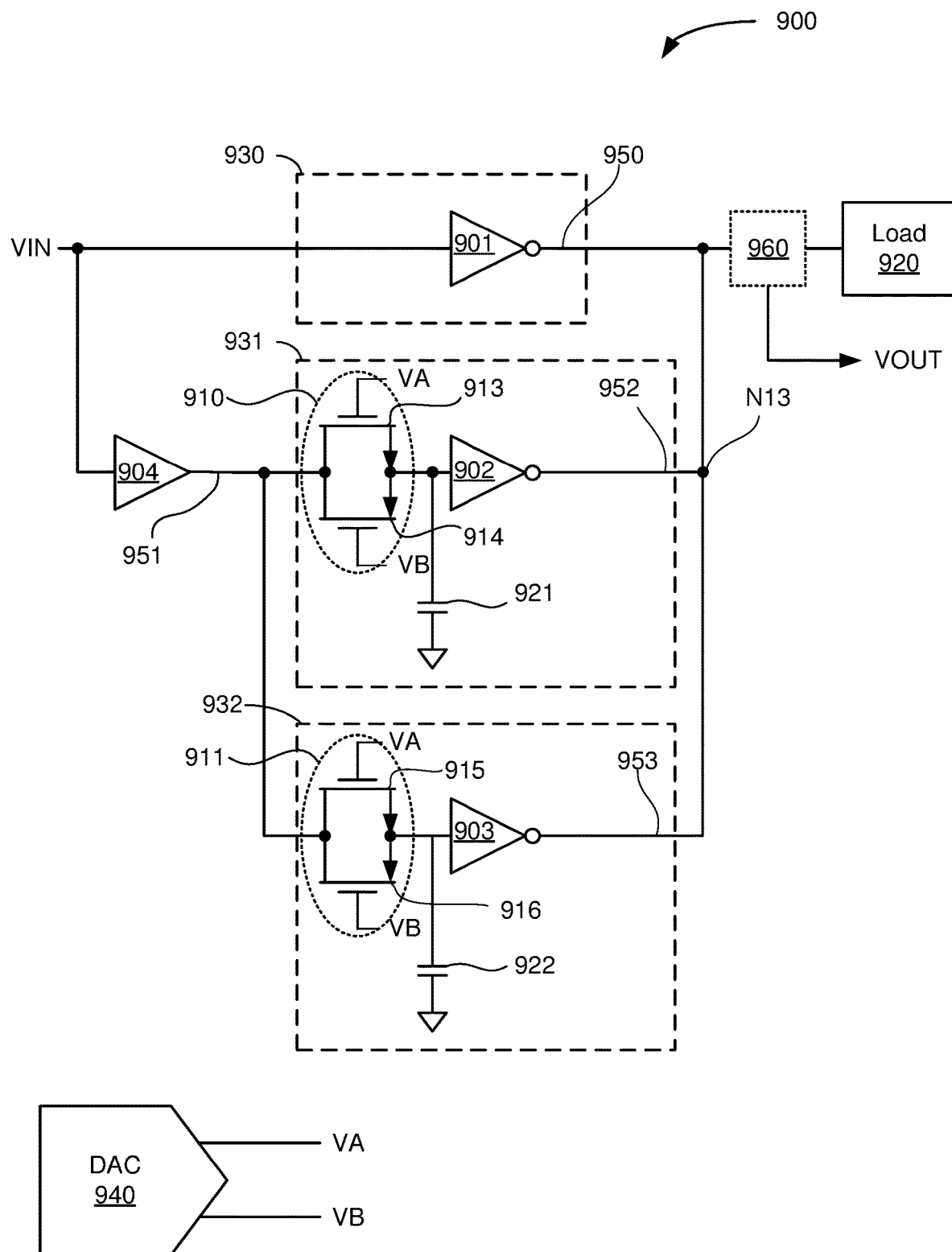
FIG. 9 shows a simplified schematic diagram of a continuous time linear equalizer.

FIG. 9 shows a simplified schematic diagram of a CTLE 900. The CTLE 900 may be an implementation of the CTLE 800 of FIG. 8. The CTLE 900 may include transconductance cells 901-903, a negative gain buffer 904, a first tunable resistor 910, a second tunable resistor 911, a first capacitor 921, a second capacitor 922, an active load 920, a passive peaking block 960, and a DAC 940. The CTLE 900 may generate an output signal VOUT based on an input signal VIN. The passive peaking block 960 may be an implementation of the passive peaking block 860 of FIG. 8. The active load 920 may be an implementation of the active load 200. The transconductance cells 901-903 and the negative gain buffer 904 may be implementations of the transconductance cells 801-803 and negative gain buffer 804, respectively.

Similar to the CTLE 800, the CTLE 900 may include an all-frequency section 930, a mid-frequency section 931, and a high-frequency section 932. The all-frequency section 930 may include the transconductance cell 901 to buffer and invert the input signal VIN and provide a first intermediate signal 950 to the node N13. The negative gain buffer 904 may also buffer and invert the input signal VIN and provide a second intermediate signal 951 to the mid-frequency section 931 and the high-frequency section 932.

The first tunable resistor 910 may include an NMOS transistor 913 and a PMOS transistor 914 configured to operate in the triode mode and provide a variable effective resistance for the mid-frequency section 931. The first tunable resistor 910 may receive and couple the second intermediate signal 951 to the transconductance cell 902 and to the first capacitor 921. The variable effective resistance from the first tunable resistor 910, the first capacitor 921, the transconductance cell 902 may buffer and select mid-frequency components of the input signal VIN and provide a third intermediate signal 952 for subtraction from the first intermediate signal 950 at node N13. In a similar manner, the second tunable resistor 911 may include an NMOS transistor 915 and a PMOS transistor 916 configured to operate in the triode mode and provide a variable effective resistance for the high-frequency section 932. The variable effective resistance from the second tunable resistor 911, the second capacitor 922, the transconductance cell 903 may buffer and select high frequency components of the input signal VIN and provide a fourth intermediate signal 953 for subtraction from the first intermediate signal 950 at node N13. In some implementations, the active load 920 may extend the operating bandwidth of the CTLE 900 by providing an equivalent L-R circuit to node N13.

The CTLE 900 may equalize the input signal VIN by selectively emphasizing and/or attenuating certain frequencies of the input signal VIN. The output signal VOUT may be based on the input signal VIN minus frequencies selected by the mid-frequency section 931 and the high-frequency section 932. The frequencies of the input signal VIN that are not attenuated are emphasized. The passive peaking block 960 may include inductors, capacitors, resistors and the like to emphasize or "peak" one or more frequencies similar to as discussed with respect to the passive peaking block 160 of FIG. 1B. Thus, as described in FIG. 1B, VOUT of the CTLE 900 may be provided by the passive peaking block 960. The passive peaking block 960 may be optional as denoted with dotted lines in FIG. 9. If the passive peaking block 960 is omitted, then VOUT may be provided at node N13.

The DAC 940 may be coupled to the first tunable resistor 910 and the second tunable resistor 911. More particularly, the DAC 940 may provide a first voltage VA to the gates of the NMOS transistors 913 and 915 and may provide a second voltage VB to the gates of the PMOS transistors 914 and 916. In some implementations, the DAC 940 may vary the voltages VA and VB to change the effective resistance provided by the NMOS transistors 913 and 915 and the PMOS transistors 914 and 916. This, in turn, may vary the effective resistance provided by the first tunable resistor 910 and the second tunable resistor 911.

In some implementations, the effective resistance of the second tunable resistor 911 may be smaller than the effective resistance of the first tunable resistor 910. Such configuration may provide greater separation between the frequencies attenuated by the mid-frequency section 931 and the frequencies attenuated by the high-frequency section 932. In one implementation, the device area associated with the second tunable resistor 911 may be greater than the device area associated with the first tunable resistor 910, causing the effective resistance of the second tunable resistor 911 to be smaller than the effective resistance of the first tunable resistor 910.

Figure 10:
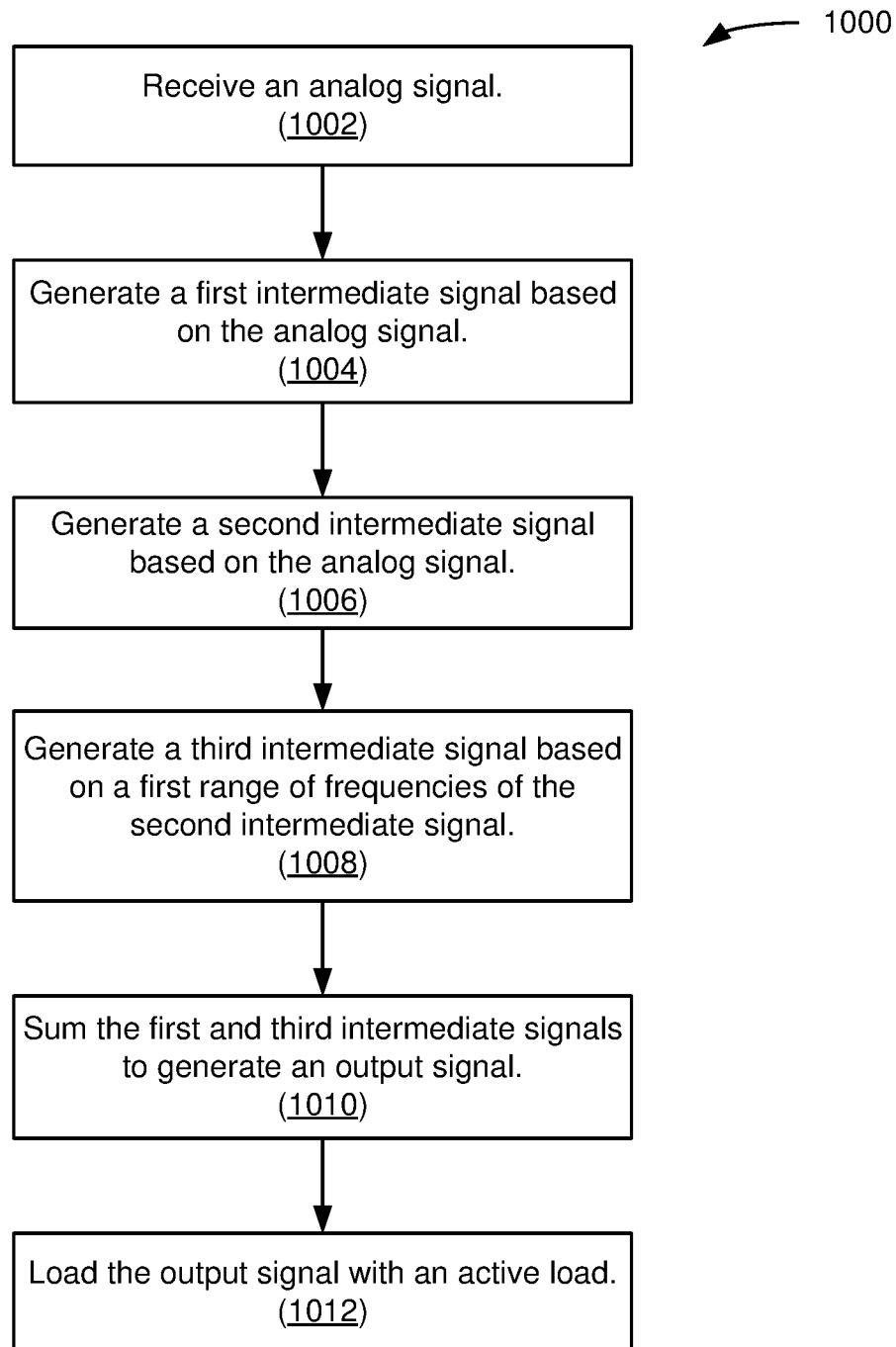
FIG. 10 shows an illustrative flowchart depicting an example operation for operating a continuous time linear equalizer.

FIG. 10 shows an illustrative flowchart depicting an example operation 1000 for operating a CTLE. Although described with respect to the CTLE 900 of FIG. 9, the operation 1000 may be used to operate any technically feasible CTLE. In some implementations, the operation described herein may include additional processes, fewer processes, processes in a different order, processes in parallel, and/or some processes that are different.

The CTLE 900 may begin by receiving an analog signal (1002). In some implementations, the analog signal may be a serial communication signal. The CTLE 900 may generate a first intermediate signal based on the analog signal (1004). For example, the transconductance cell 901 may receive the input signal VIN and generate the first intermediate signal 950.

The CTLE 900 may generate a second intermediate signal based on the analog signal (1006). For example, the negative gain buffer 904 may receive the input signal VIN and generate the second intermediate signal 951. The CTLE 900 may generate a third intermediate signal based on a first range of frequencies of the second intermediate signal (1008). For example, the mid-frequency section 931 may receive the second intermediate signal 951 and generate a third intermediate signal 952 based on a first range of frequencies.

The CTLE 900 may sum the first and third intermediate signals to generate an output signal (1010). For example, the output signal VOUT at node N13 may be based on the third intermediate signal 952 subtracted from the first intermediate signal 950. In some implementations, other intermediate signals may be subtracted from the output signal VOUT. For example, the high-frequency section 932 may receive the second intermediate signal 951 and generate a fourth intermediate signal 953 based on a second range of frequencies. The fourth intermediate signal 953 may also be subtracted from the output signal VOUT. The output signal of the CTLE 900 may be loaded by an active load (1012). For example, the output signal VOUT may be received by the active load 920.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosure.

The methods, sequences or algorithms described in connection with the aspects disclosed herein may be embodied directly in hardware, in a software module executed by a processor, or in a combination of the two. A software module may reside in RAM latch, flash latch, ROM latch, EPROM latch, EEPROM latch, registers, hard disk, a removable disk, a CD-ROM, or any other form of storage medium known in the art. An example storage medium is coupled to the processor such that the processor can read information from, and write information to, the storage medium. In the alternative, the storage medium may be integral to the processor.

In the foregoing specification, the example implementations have been described with reference to specific example implementations thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. An analog signal buffer, comprising:
a first cell configured to receive a first voltage and output a second voltage based on the first voltage; and
an active load configured to receive the first voltage and extend a bandwidth of the analog signal buffer, the active load comprising:
a first PMOS transistor having a source coupled to a supply voltage;
a first NMOS transistor having a source coupled to ground, a drain coupled to a drain of the first PMOS transistor and an output of the first cell, and a gate coupled to a gate of the first PMOS transistor;
a first active feedback structure configured to couple the drains of the first PMOS transistor and the first NMOS transistor to the gates of the first PMOS transistor and the first NMOS transistor; and
a second active feedback structure coupled in parallel with the first active feedback structure, the second active feedback structure having:
a third NMOS transistor having a source coupled to the drains of the first PMOS transistor and the first NMOS transistor and a drain coupled to the gates of the first PMOS transistor and the first NMOS transistor; and
a third PMOS transistor having a source coupled to the drains of the first PMOS transistor and the first NMOS transistors and a drain coupled to the gates of the first PMOS transistor and the first NMOS transistor, wherein the second active feedback structure is configured to decrease a feedback resistance for the active load.

2. The analog signal buffer of claim 1, wherein the active load is configured to provide an inductive-resistive load to the first cell based on a transconductance of the first PMOS transistor and the first NMOS transistor.

3. The analog signal buffer of claim 1, wherein the first active feedback structure is configured to provide a feedback resistance for the active load.

4. The analog signal buffer of claim 1, wherein the first active feedback structure comprises:

a second NMOS transistor having a source coupled to the drains of the first PMOS transistor and the first NMOS transistor and a drain coupled to the gates of the first PMOS transistor and the first NMOS transistor; and a second PMOS transistor having a source coupled to the drains of the first PMOS transistor and the first NMOS transistor and a drain coupled to the gates of the first PMOS transistor and the first NMOS transistor.

5. The analog signal buffer of claim 4, wherein a gate of the second NMOS transistor is coupled to the supply voltage and a gate of the second PMOS transistor is coupled to ground.

6. The analog signal buffer of claim 4, wherein the second NMOS transistor and the second PMOS transistor are configured to operate in triode mode.

7. The analog signal buffer of claim 4, wherein the gate of the second NMOS transistor is coupled to a first output of a digital-to-analog converter (DAC) and the gate of the second PMOS transistor is coupled to a second output of the DAC.

8. The analog signal buffer of claim 1, wherein channel area of the third NMOS and PMOS transistors is different from channel area of the second NMOS and PMOS transistors.

9. The analog signal buffer of claim 1, wherein the active feedback structure further comprises:
  a third active feedback structure coupled in parallel with the first active feedback structure, the third active feedback structure having:
    a fourth NMOS transistor having a source coupled to the drains of the first PMOS transistor and the first NMOS transistor;
    a fourth PMOS transistor having a source coupled to the drains of the first PMOS transistor and the first NMOS transistors;
    a fifth NMOS transistor having a source coupled to the drains of the fourth NMOS and PMOS transistors and a drain coupled to the gates of the first PMOS transistor and the first NMOS transistor; and
    a fifth PMOS transistor having a source coupled to the drains of the fourth NMOS and PMOS transistors and a drain coupled to the gates of the first PMOS transistor and the first NMOS transistor.

10. A transimpedance amplifier comprising:
  a first cell configured to receive a first signal and output a second signal; and
  a second cell coupled to the first cell comprising:
    a first PMOS transistor having a source coupled to a supply voltage;
    a first NMOS transistor having a source coupled to ground, a drain coupled to a drain of the first PMOS transistor and configured to output a third signal, and a gate coupled to a gate of the first PMOS transistor and configured to receive the second signal;
    a first active feedback structure configured to couple an output of the second cell to an input of the second cell; and
    a second active feedback structure coupled in parallel with the first active feedback structure, the second active feedback structure having:
      a third NMOS transistor having a source coupled to the drains of the first PMOS transistor and the first NMOS transistor and a drain coupled to the gates of the first PMOS transistor and the first NMOS transistor; and
      a third PMOS transistor having a source coupled to the drains of the first PMOS transistor and the first NMOS transistors and a drain coupled to the gates of the first PMOS transistor and the first NMOS transistor, wherein the second active feedback structure is configured to decrease a feedback resistance for the second cell.

11. The transimpedance amplifier of claim 10, wherein the first active feedback structure comprises:
  a second NMOS transistor having a source coupled to the drain of the first PMOS transistor and the first NMOS transistor and a drain coupled to the gates of the first PMOS transistor and the first NMOS transistors; and
  a second PMOS transistor having a source coupled to the drains of the first PMOS transistor and the first NMOS transistor and a drain coupled to the gates of the first PMOS transistor and the first NMOS transistors.

12. The transimpedance amplifier of claim 11, wherein the second NMOS transistor and the second PMOS transistor are configured to operate in a triode mode.

13. The transimpedance amplifier of claim 11, wherein the first active feedback structure is configured to provide a variable feedback resistance for the second cell.

14. The transimpedance amplifier of claim 13, further comprising:
  a digital-to-analog converter (DAC) coupled to the first active feedback structure and configured to generate a voltage to adjust the variable feedback resistance.

15. The transimpedance amplifier of claim 14, wherein output signals from the DAC are coupled to gates of the second NMOS transistor and the second PMOS transistor.

16. The transimpedance amplifier of claim 10, wherein channel area of the third NMOS and PMOS transistors is different from channel area of the second NMOS and PMOS transistors.

17. The transimpedance amplifier of claim 11, wherein the second cell further comprises:
  a third active feedback structure coupled in parallel with the first active feedback structure, the third active feedback structure having:
    a fourth NMOS transistor having a source coupled to the drains of the first PMOS transistor and the first NMOS transistor;
    a fourth PMOS transistor having a source coupled to the drains of the first PMOS transistor and the first NMOS transistors;
    a fifth NMOS transistor having a source coupled to the drains of the fourth NMOS and PMOS transistors and a drain coupled to the gates of the first PMOS transistor and the first NMOS transistor; and
    a fifth PMOS transistor having a source coupled to the drains of the fourth NMOS and PMOS transistors and a drain coupled to the gates of the first PMOS transistor and the first NMOS transistor.

* * * * *